United States Patent
Xia et al.

(10) Patent No.: US 9,546,090 B1
(45) Date of Patent: Jan. 17, 2017

(54) INTEGRATED MEMS-CMOS DEVICES AND METHODS FOR FABRICATING MEMS DEVICES AND CMOS DEVICES

(71) Applicant: GLOBALFOUNDRIES Singapore Pte. Ltd., Singapore (SG)

(72) Inventors: Jia Jie Xia, Singapore (SG); Nagarajan Ranganathan, Singapore (SG); Rakesh Kumar, Singapore (SG); Aveek Nath Chatterjee, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/826,449

(22) Filed: Aug. 14, 2015

(51) Int. Cl.
    *B81B 7/00* (2006.01)
    *B81C 1/00* (2006.01)

(52) U.S. Cl.
    CPC ........... *B81B 7/007* (2013.01); *B81C 1/00246* (2013.01); *B81B 2207/015* (2013.01); *B81B 2207/07* (2013.01); *B81C 2201/013* (2013.01); *B81C 2201/019* (2013.01); *B81C 2201/053* (2013.01); *B81C 2203/0735* (2013.01)

(58) Field of Classification Search
    CPC ................................... H01P 1/10; H01L 21/00

USPC .............................. 257/414, 254, 340, 390, E27.081,257/E29.324; 438/48, 125, 478
See application file for complete search history.

(56) References Cited

U.S. PATENT DOCUMENTS

| | | | |
|---|---|---|---|
| 7,868,419 B1* | 1/2011 | Kerr et al. | 257/531 |
| 8,367,451 B2 | 2/2013 | Qiu | |
| 8,421,082 B1* | 4/2013 | Yang | 257/69 |
| 2007/0115081 A1* | 5/2007 | Kim et al. | 333/262 |
| 2007/0281381 A1* | 12/2007 | Ayazi | 438/52 |
| 2009/0134459 A1* | 5/2009 | Goto et al. | 257/347 |
| 2009/0278628 A1* | 11/2009 | Sworowski et al. | 333/186 |
| 2010/0273286 A1* | 10/2010 | Liang et al. | 438/50 |
| 2013/0168740 A1* | 7/2013 | Chen | 257/254 |
| 2015/0179505 A1* | 6/2015 | Stuber et al. | 438/478 |

FOREIGN PATENT DOCUMENTS

EP      2693182 A1    2/2014

* cited by examiner

*Primary Examiner* — Sheng Zhu
(74) *Attorney, Agent, or Firm* — Lorenz & Kopf, LLP (57) ABSTRACT

Integrated MEMS-CMOS devices and methods for fabricating MEMS devices and CMOS devices are provided. An exemplary method for fabricating a MEMS device and a CMOS device includes forming the CMOS device in and/or over a first side of a semiconductor substrate. Further, the method includes forming the MEMS device in and/or under a second side of the semiconductor substrate. The second side of the semiconductor substrate is opposite the first side of the semiconductor substrate.

12 Claims, 8 Drawing Sheets

INTEGRATED MEMS-CMOS DEVICES AND METHODS FOR FABRICATING MEMS DEVICES AND CMOS DEVICES

TECHNICAL FIELD

The technical field generally relates to Micro-Electro-Mechanical-Systems (MEMS) devices and complementary metal-oxide-semiconductor (CMOS) devices, and more particularly relates to integrated MEMS-CMOS devices and methods for fabricating such devices.

BACKGROUND

Research and development in integrated microelectronics have continued to produce astounding progress in CMOS and MEMS. CMOS technology has become the predominant fabrication technology for integrated circuits. MEMS technology continues to rely upon conventional processing. In layman's terms, microelectronic integrated circuits are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, and accelerometers in sensor-equipped game devices. These technologies are becoming ever more prevalent in society every day. Use of integrated circuits and MEMS has limitless applications through modular measurement devices such as accelerometers, gyroscopes, actuators, microphones, and sensors including magnetic field sensors, pressure sensors, humidity sensors, temperature sensors, chemical sensors, biosensors, and inertial sensors Monolithic integration of MEMS devices and CMOS devices offers significant benefits enabling high volume production driving down the per-unit costs of sensor and actuator systems significantly. Micromechanical transducer systems not only need to receive analog and digital electrical inputs and transmit the output, but should also be able to measure rotation, strain, temperature, pressure, acceleration, infrared radiation, or micro fluidic chemical properties of liquids and gasses. Effective integration offers other benefits, including, simplifying interconnect issues, reduced packaging and fabrication complexity and significantly improving the overall performance and ease of use for the device.

One approach to the monolithic integration of CMOS and MEMS is to modify the complementary metal-oxide semiconductor (CMOS) foundry facility to fabricate micromechanical structures. In such an approach, CMOS devices and MEMS devices may be fabricated side-by-side on a semiconductor substrate. A disadvantage of this arrangement is cross talk caused by the MEMS devices and CMOS devices. Shielding has been proposed to reduce cross talk; however, use of shielding increases processing costs as well as the chip space required by the devices.

Accordingly, it is desirable to provide a method for fabricating an improved integrated MEMS-CMOS device. Further, it is desirable to provide an improved integrated MEMS-CMOS device. Also, it is desirable to provide an improved method for fabricating MEMS devices and CMOS devices on a substrate. Furthermore, other desirable features and characteristics will become apparent from the subsequent detailed description and the appended claims, taken in conjunction with the accompanying drawings and this background.

BRIEF SUMMARY

Integrated MEMS-CMOS devices and methods for fabricating MEMS devices and CMOS devices are provided. In one embodiment, a method for fabricating a MEMS device and a CMOS device includes forming the CMOS device in and/or over a first side of a semiconductor substrate. Further, the method includes forming the MEMS device in and/or under a second side of the semiconductor substrate. The second side of the semiconductor substrate is opposite the first side of the semiconductor substrate.

In another exemplary embodiment, a method for fabricating a vertically integrated MEMS-CMOS device is provided. The method includes providing a semiconductor substrate defining a center plane. The method forms a CMOS device over the semiconductor substrate. Further, the method forms a MEMS device under the semiconductor substrate. The center plane is located between the CMOS device and the MEMS device.

In yet another exemplary embodiment, a vertically integrated MEMS-CMOS device includes a substrate having a first side and a second side opposite the first side. The vertically integrated MEMS-CMOS device includes a CMOS device located in and/or over the first side of the substrate. Further, the vertically integrated MEMS-CMOS device includes a MEMS device located in and/or under the second side of the substrate.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein:

FIGS. 1-6 illustrate exemplary steps for the formation of a CMOS device over a side of a semiconductor substrate in accordance with an embodiment herein;

FIGS. 7-12 illustrate exemplary steps for the formation of a MEMS device under an opposite side of the semiconductor substrate of FIGS. 1-6, in accordance with an embodiment herein;

FIGS. 13-15 illustrate exemplary steps for the formation of a MEMS device under an opposite side of the semiconductor substrate of FIGS. 1-6, in accordance with another embodiment herein.

DETAILED DESCRIPTION

The following detailed description is merely exemplary in nature and is not intended to limit the integrated MEMS-CMOS devices, methods for fabricating integrated MEMS-CMOS devices, or methods for fabricating MEMS devices and CMOS devices. Furthermore, there is no intention to be bound by any expressed or implied theory presented in the preceding technical field, background or brief summary, or in the following detailed description.

For the sake of brevity, conventional techniques related to conventional device fabrication may not be described in detail herein. Moreover, the various tasks and process steps described herein may be incorporated into a more comprehensive procedure or process having additional steps or functionality not described in detail herein. In particular, various steps in the fabrication of MEMS and CMOS devices are well-known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

As used herein, it will be understood that when an element or layer is referred to as being "over" or "under" another element or layer, it may be directly on the other element or layer, or intervening elements or layers may be present. When an element or layer is referred to as being "on" another element or layer, it is directly on and in contact with the other element or layer. Further, spatially relative terms, such as "upper", "over", "lower", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As described herein, a vertically-aligned integrated MEMS-CMOS device is fabricated by forming one or more CMOS devices in or over a side of a semiconductor substrate and by forming one or more MEMS devices in or under an opposite side of the semiconductor substrate. The distance between the CMOS device(s) and MEMS device(s) includes the thickness of the semiconductor substrate. Also, the semiconductor substrate may be provided as high resistivity silicon, thereby further inhibiting cross talk between MEMS and CMOS devices. As a result, interlayer dielectric over a device is not necessary for sufficient resistivity. Also, due to the vertical alignment of the CMOS device(s) and MEMS device(s), the integrated MEMS-CMOS device takes up less chip size as compared to conventional side-by-side structures.

Figure 13:
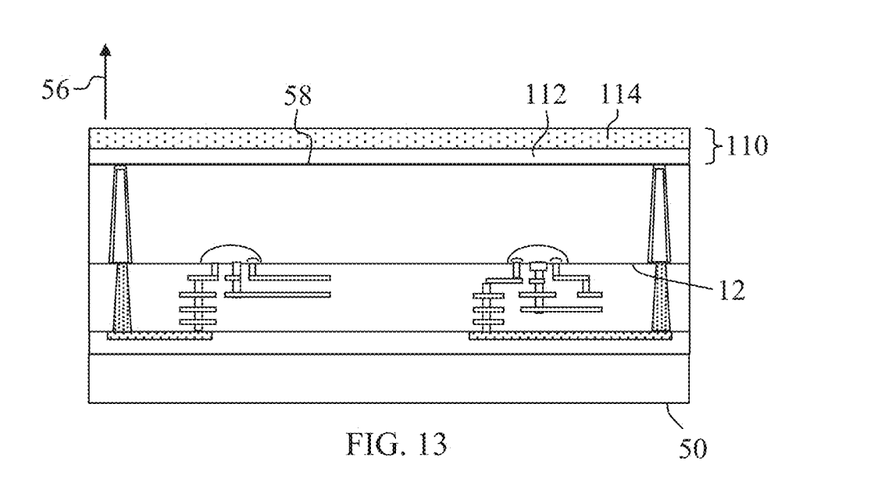
Figure 14:
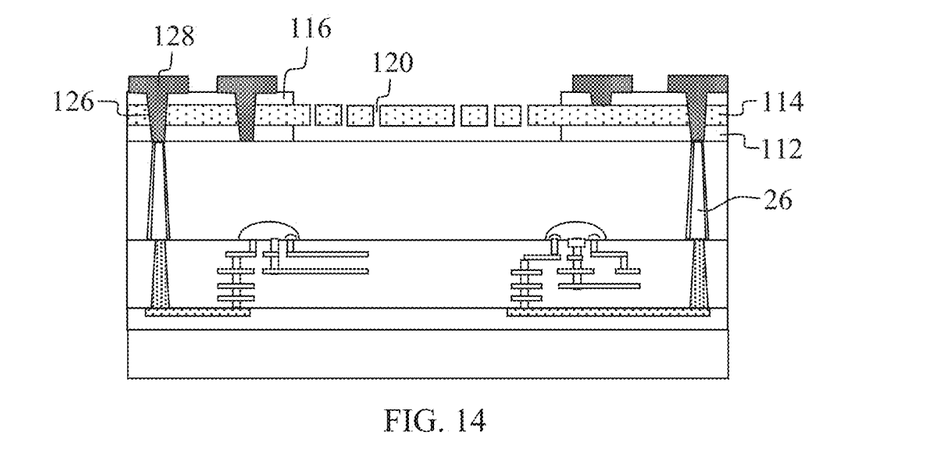
Figure 15:
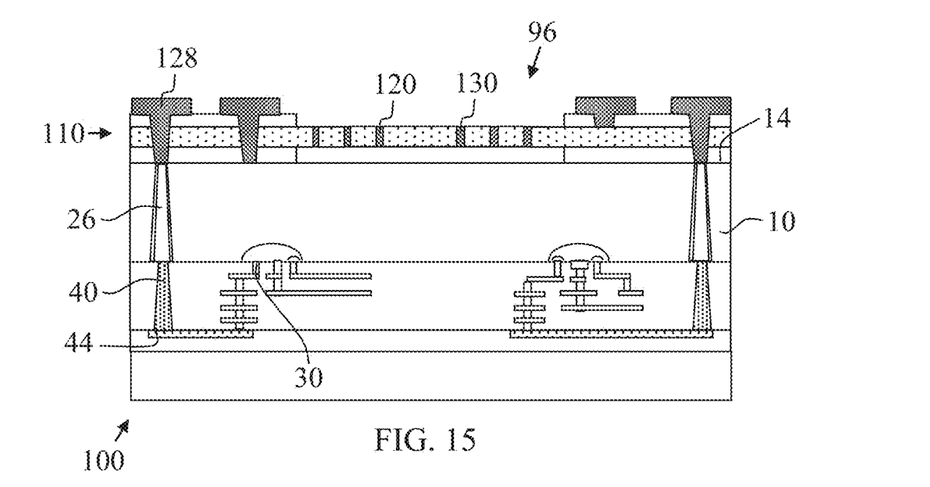

FIGS. 1-6 illustrate exemplary steps for the formation of a CMOS device over a side of a semiconductor substrate. FIGS. 7-12 illustrate exemplary steps for the formation of a MEMS device under an opposite side of the semiconductor substrate of FIGS. 1-6. FIGS. 13-15 illustrate exemplary steps for the formation of a MEMS device under an opposite side of the semiconductor substrate of FIGS. 1-6, in accordance with another embodiment.

Figure 1:
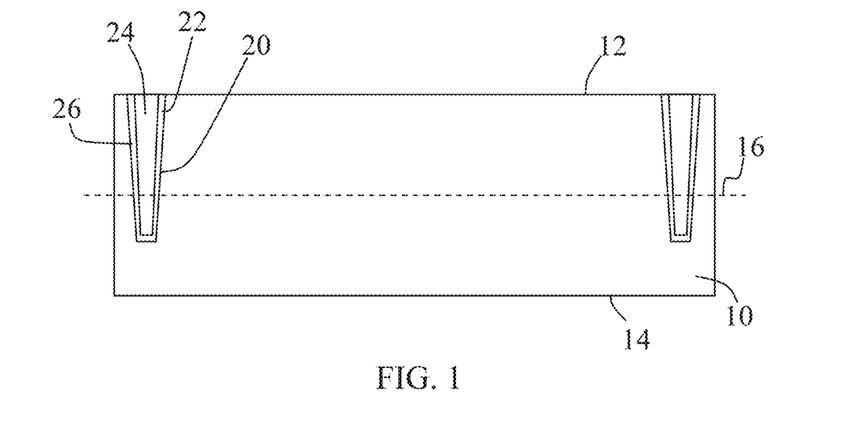
FIGS. 1-15 illustrate, in cross section, exemplary methods for fabricating a MEMS device and CMOS device.

In FIG. 1, a semiconductor substrate 10 is provided and processed. It is to be appreciated that various fabrication techniques may be conducted in accordance with the methods described herein to form the semiconductor substrate 10 as shown. Herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor substrate 10 may include a compound semiconductor such as silicon carbide, silicon germanide, gallium arsenide, gallium nitride, indium arsenide, indium gallium arsenide, indium gallium arsenide phosphide, or indium phosphide and combinations thereof. In an exemplary embodiment, the semiconductor material is a silicon substrate. As referred to herein, a material that includes a recited element/compound includes the recited element/compound in an amount of at least 25 weight percent based on the total weight of the material unless otherwise indicated.

An exemplary semiconductor substrate is formed by high resistivity silicon, such as silicon having resistivity greater than 40 ohm-cm. An exemplary semiconductor substrate 10 is a bulk silicon wafer. An exemplary semiconductor substrate has a thickness of from about 250 to about 1000 microns, such as from about 400 to about 600 microns. As shown the semiconductor substrate 10 includes a planar surface at side 12 and a planar surface at an opposite side 14. Further, the semiconductor substrate 10 defines a center plane 16 parallel to and equidistant from the sides 12 and 14. In the context of FIG. 1, side 12 may be considered to be an "upper" side and side 14 may be considered to be a "lower" side, such that side 12 is positioned "over" the center plane 16 and side 14 is positioned "under" the center plane 16. The orientation of FIG. 1 will be used in naming spatial elements or relationships despite the rotation of the semiconductor substrate 10 in later Figures, as will be explained.

In FIG. 1, a via formation process has commenced. Specifically, masking and etching has been performed similar to a conventional through silicon via (TSV) formation process. Through-silicon-vias can be formed utilizing a variety of different approaches, which are conventionally known and which may be performed at various junctures throughout fabrication processes. Useful approaches for forming TSVs include, but are not limited to, "Via First prior to Front-End-of-the-Line (FEOL)," "Via First after Back-End-of-the-Line (BEOL)," and "Via Last" approaches, all of which are well-documented in industry literature. The vias described herein can be formed utilizing any TSV formation technique, whether currently known or later developed. To provide one non-limiting example, an illustrative fabrication method utilizing a "Via First prior to FEOL" approach includes etching blind vias 20 within semiconductor substrate 10. Blind vias 20 extend through side 12 and toward side 14 of semiconductor substrate 10, but do not penetrate through to side 14 of semiconductor substrate 10. In the illustrated embodiment, the blind vias 20 pass through the center plane 16. In one embodiment, blind vias 20 extend from about 50 to about 500 microns into semiconductor substrate 10. Blind vias 20 can be formed utilizing a number of conventionally-known processes, including laser drilling and anisotropic etching processes. In an exemplary embodiment, blind vias 20 are formed utilizing photolithography and etching processes capable of producing vias having relatively high aspect ratios. As a specific example, blind vias 20 may be formed utilizing a deep reactive ion etching process, such as a two mode Bosch process. In the first mode of the Bosch process, an anisotropic plasma etch is performed utilizing a chemistry selective to semiconductor substrate 10; e.g., when semiconductor substrate 10 includes silicon, a sulfur hexafluoride chemistry ($SF_6$) is conveniently employed. In the second mode of the Bosch process, a chemically inert passivation layer is deposited over semiconductor substrate 10 utilizing, for example, an octafluorobutene ($C_4F_8$) source gas. By continually alternating between the first mode and the second mode of the Bosch process, vias having nearly vertical sidewalls and relatively high aspect ratios (such as, for example, approximately 28:1 or up to about 50:1) can be formed in semiconductor substrate 10.

As will become apparent in the course of the subsequent description, the location at which blind vias 20 are formed within semiconductor substrate 10 will generally be determined by MEMS device and CMOS device layout; i.e., the locations at which electrical interconnections will ultimately be formed over and under the semiconductor substrate 10. As noted above, and as will be described more fully below, blind vias 20 are utilized to electrically couple one or more frontside CMOS devices to one or more backside MEMS devices. In the illustrated example, multiple (e.g., two) blind vias 20 are formed within semiconductor substrate 10.

After the formation of blind vias 20, a liner 22 is formed on the side 12 of the semiconductor substrate 10, including within the blind vias 20. An exemplary liner 22 is formed by liner material, such as silicon oxide. In an exemplary embodiment, the liner material is deposited with a linear oxide deposition process, such as by thermal oxidation or by chemical vapor deposition (CVD). An exemplary liner 22 is formed with a thickness of from about 1 to about 10 microns, such as from about 1 to about 3 microns.

After formation of the liner 22, the method may continue with the deposition of a conductive material to form a conductive plug 24 within each blind via 20. An exemplary conductive material is doped polysilicon. In an exemplary embodiment, the conductive material is deposited by low pressure chemical vapor deposition (LPCVD). The conductive material is deposited to fill the blind vias 20 as well as form an overburden portion over the side 12 of the semiconductor substrate 10. In FIG. 1, the overburden portion is removed by a chemical mechanical planarization (CMP) and clean process. Further, the liner material deposited outside of the blind vias 20 is removed by wet or dry etch. Additionally, a polysilicon recess process may be performed, such as by wet or dry etch to lower the surface of the polysilicon within the blind vias 20. The liner 22 and conductive plug 24 may be considered to form a conductive interconnect 26.

Figure 2:
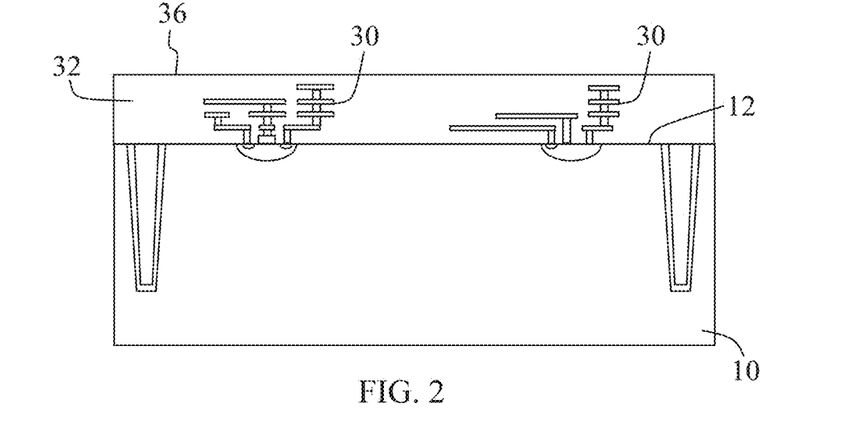

The method continues in FIG. 2 with conventional CMOS device fabrication processing. Specifically, one or more CMOS devices 30 are formed in and/or over the side 12 of the semiconductor substrate 10 in accordance with conventional processing. As shown, an interlayer dielectric 32, or a plurality of dielectric layers, is formed over the side 12 of the semiconductor substrate 10 and encapsulates the CMOS devices 30. In an exemplary embodiment, the interlayer dielectric 32 is planarized to surface 36, which is parallel to surface of side 12.

Figure 3:
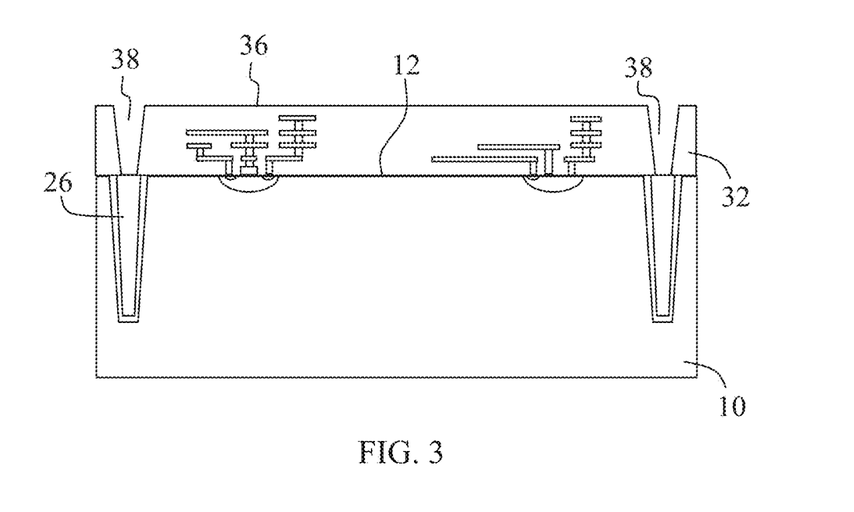

In FIG. 3, a trench 38 is etched over each interconnect 26. Specifically, a mask (not shown) is formed over the surface 36 of the interlayer dielectric 32 and is patterned before an etch process is performed to form the trenches 38. In an exemplary embodiment, the mask is formed by a plasma-enhanced chemical vapor deposition (PECVD) process that deposits a thick oxide over the interlayer dielectric 32, i.e., oxide having a thickness of greater that about 10 microns. Then, a plasma etch process is performed to etch the unmasked regions of the interlayer dielectric 32. The etch reaches the side 12 of the semiconductor substrate 10 and exposes each interconnect 26. After performing the etch, the mask is removed, such as by a wet clean process.

Figure 4:
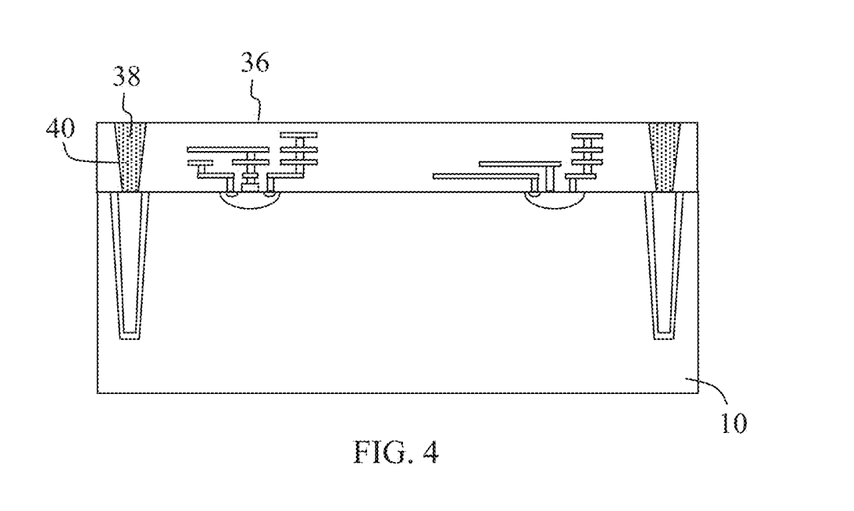

As shown in FIG. 4, a contact plug 40 is formed in each trench 38. An exemplary contact plug 40 is formed from a metal material such as tungsten. In an exemplary embodiment, the material is deposited by CVD. The material fills the trench 38 and may form an overburden portion over the surface 36 of the interlayer dielectric 32. A CMP process may be performed to remove the overburden portion of the material to form the contact plug 40 within each trench 38.

Figure 5:
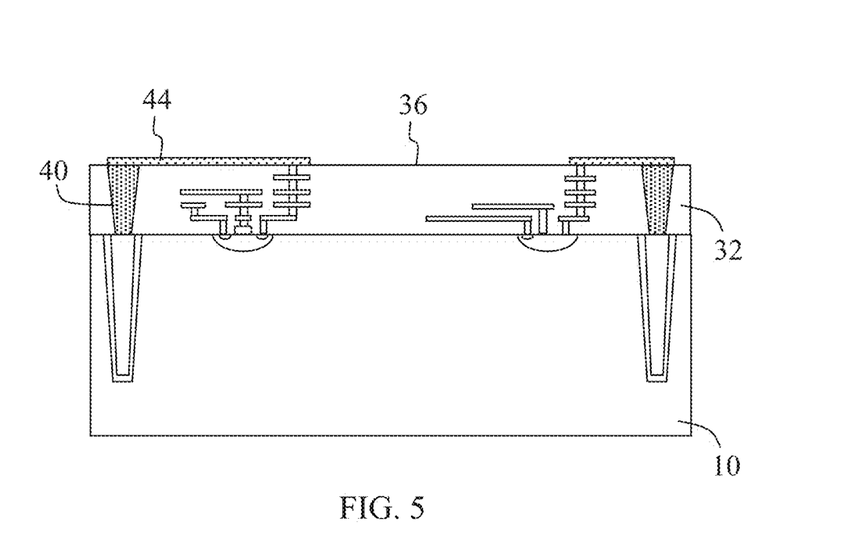

In FIG. 5, a conductive material is deposited over the contact plug 40 and the surface 36 of the interlayer dielectric 32. An exemplary conductive material is copper, tungsten, or aluminum or alloys thereof. The conductive material may be deposited by physical vapor deposition (PVD). The conductive material is then etched to form a conductive line 44 in electrical connection with each contact plug 40. For example, a lithography mask may be formed over the conductive material and patterned before an etch process to define the conductive lines 44. The mask is then removed.

Figure 6:
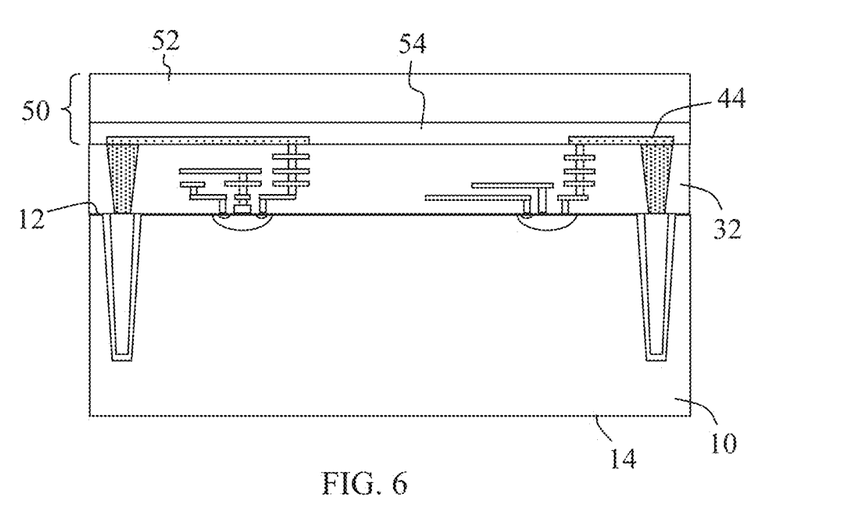

As shown in FIG. 6, a protective layer 50 is formed over the conductive lines 44 and interlayer dielectric 32. The protective layer 50 may be a wafer, film, tape or other suitable material. In an exemplary embodiment, the protective layer 50 includes a wafer 52. An exemplary wafer 52 is silicon. The wafer 52 may be bonded to the conductive lines 44 and interlayer dielectric 32 through eutectic bonding, adhesive bonding, fusion bonding, or another suitable bonding technique. For eutectic bonding, the protective layer 50 includes an intermediate layer 54, such as gold, aluminum, an alloy thereof or another conventional eutectic alloy. For adhesive bonding, the protective layer includes an intermediate layer 54, such as an organic or inorganic adhesive. For example, the intermediate layer 54 may be an epoxy or benzocyclobutene (BCB). For fusion bonding, the intermediate layer 54 may be absent from the protective layer 50. Rather, wafer 52 is forced into contact with the conductive lines 44 and interlayer dielectric 32 and may be anneal to form a bond between the protective layer 50 and the conductive lines 44 and interlayer dielectric 32.

In FIGS. 7-12, the semiconductor substrate 10 is flipped or rotated 180 degrees such that the side 12 is at the bottom of the Figures. This flipped orientation is representative of the actual processing of the semiconductor substrate 10. In other words, the CMOS device processing is completed on side 12 and the semiconductor substrate 10 is flipped so that processing of side 14 can be commenced to form MEMS devices. However, spatial references to the processing of side 14 will be made with the orientation of FIGS. 1-6. For clarity, arrow 56 points downward for the purposes of this description despite the actual orientation of the semiconductor substrate 10 during processing.

Figure 7:
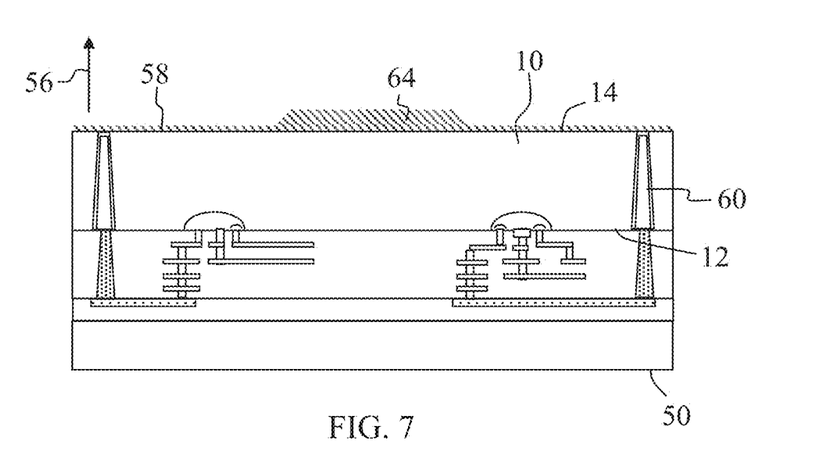

In FIG. 7 a grinding process is performed to remove the portion of the semiconductor substrate 10 under each blind via 20, i.e., between each blind via 20 and side 14. As a result, the semiconductor substrate 10 is recessed to a recessed surface 58 at side 14 and each blind via 20 is exposed and formed as a through via 60. Each through via 60 extends from side 12 to side 14, as recessed.

After establishing the through vias 60, a trap-rich material may be formed on the recessed surface 58. For example, an argon implant process may be performed to convert the recessed surface 58 into a trap-rich material to increase the effective resistivity of the semiconductor substrate 10. Then, the MEMS device fabrication process deposits and etches a sacrificial material to form sacrificial layer 64 under the recessed surface 58 of side 14. For example, the sacrificial material may be oxide. In an exemplary embodiment, the sacrificial material is deposited by CVD. Then a mask is formed and patterned under the sacrificial material before the sacrificial is etched to form the sacrificial layer 64 shown in FIG. 7.

Figure 8:
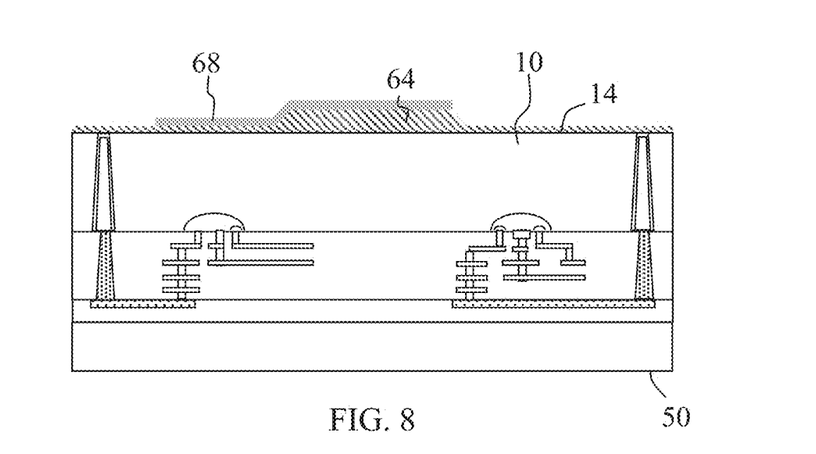

The method continues in FIG. 8 with the formation of a first electrode 68 for the MEMS device. Specifically, the first electrode 68 may be formed by depositing and etching an electrode material such as molybdenum under the sacrificial layer 64. In an exemplary embodiment, the electrode material is deposited by PVD. A hard mask, such as oxide, is formed and patterned under the electrode material before an etch process, such as a plasma etch, is performed to define the first electrode 68.

Figure 9:
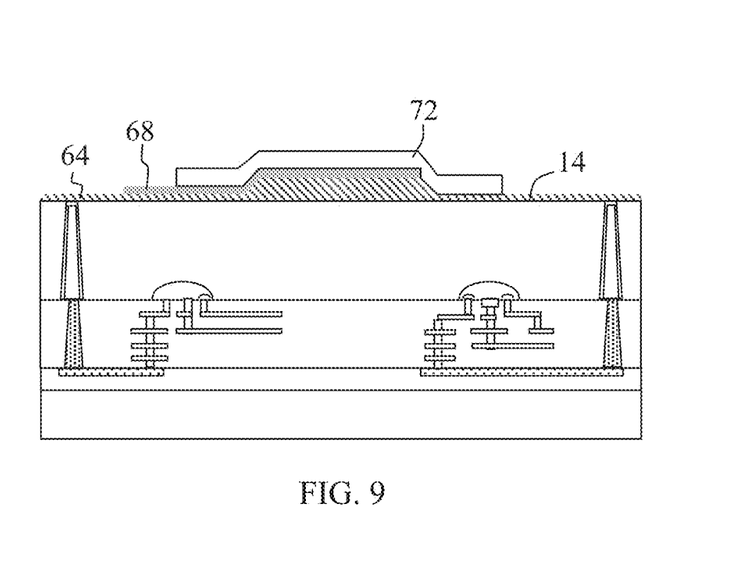

In FIG. 9, a thin film 72 is formed under the first electrode 68 and under the sacrificial layer 64. As shown, different portions of the thin film 72 directly contact the first electrode 68 and the sacrificial layer 64. In an exemplary embodiment, the thin film 72 is formed from a thin film material that is piezoelectric. For example, the thin film 72 may be formed from aluminum nitride (AlN) or another suitable piezoelectric material. In an exemplary embodiment, the thin film 72 is formed by depositing the thin film material by PVD, formation and patterning of a mask under the thin film material, and etching of the thin film material to define the thin film 72. The mask is then removed.

Figure 10:
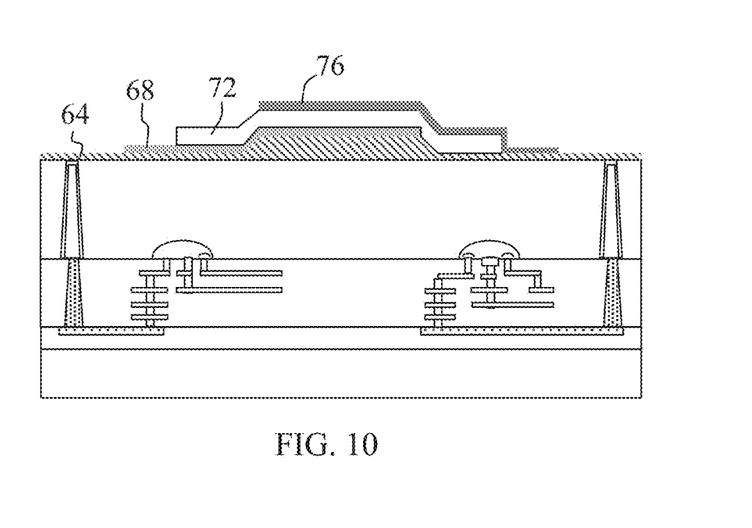

The method continues in FIG. 10 with the formation of a second electrode 76 for the MEMS device. Specifically, the second electrode 76 may be formed by depositing and etching an electrode material such as molybdenum under the thin film 72. As shown, the different portions of the second electrode 76 may contact the thin film 72 and the sacrificial layer 64. In an exemplary embodiment, the electrode material is deposited by PVD. A hard mask, such as oxide, is formed and patterned under the electrode material before an etch process, such as a plasma etch, is performed to define the second electrode 76.

Figure 11:
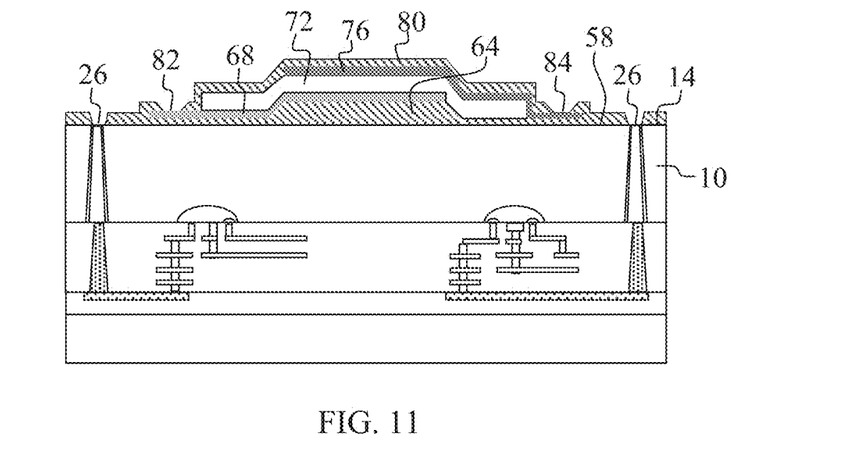

A contact layer 80 is formed under the second electrode 76, thin film 72, first electrode 68, and sacrificial layer 64 in FIG. 11. An exemplary contact layer 80 formed from contact layer material such as oxide. An exemplary contact layer material is the same material that forms the sacrificial layer 64. In an exemplary embodiment, contact layer material is deposited by CVD. A mask is formed under the contact layer material and is patterned before the contact layer material is etched to form the contact layer 80. The mask is then removed. The contact layer 80 exposes each interconnect 26 at the recessed surface 58 of side 14 of the semiconductor substrate 10, as well as a selected region 82 of the first electrode 68 and a selected region 84 of the second electrode 76.

Figure 12:
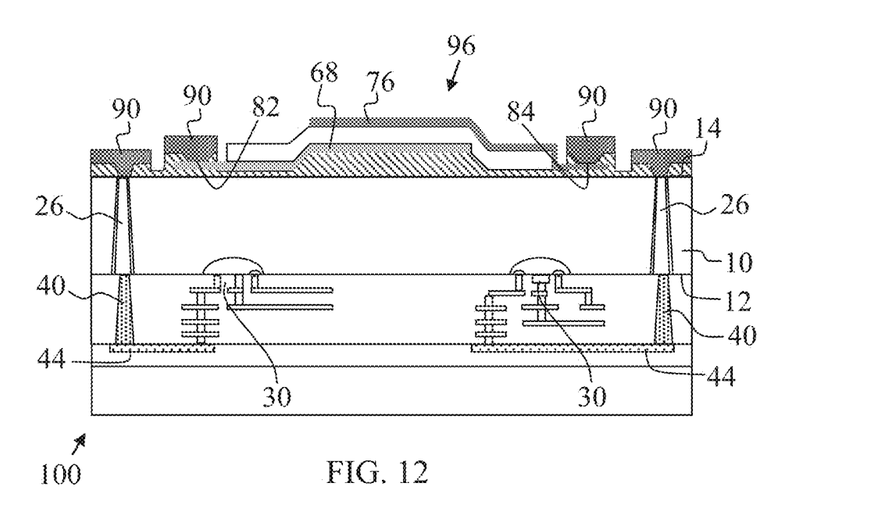

In FIG. 12, a conductive pad 90 is formed on each conductive region exposed by the contact layer 80 in FIG. 11. Specifically, a conductive material such as a metal like tungsten or copper, is deposited under the contact layer 80, each exposed interconnect 26, the exposed region 82 of the first electrode 68, and the exposed region 84 of the second electrode 76. After deposition of the conductive material, a mask is formed and patterned under the conductive material and an etch is performed to define the conductive pads 90. The mask is then removed.

Further, in FIG. 12, a release etch is performed to remove the sacrificial layer 64 (shown in FIG. 11) and the contact layer 80 (shown in FIG. 11). For example, for embodiments in which the sacrificial layer material and the contact layer material are oxide, an etch may be performed with vapor hydrofluoric acid (VHF). As a result, a MEMS device 96 is formed under side 14 of the semiconductor substrate 10.

It is noted that FIGS. 7-12 describe a surface machining process for forming the MEMS device. A surface machining process uses a succession of thin film deposition and selective etching. Alternatively, a bulk machining process may be used. For example, FIGS. 13-15 illustrate a bulk machining process. A bulk micromachining process defines structures by selectively etching inside a substrate. Whereas surface micromachining creates structures on top of a substrate, bulk micromachining produces structures inside a substrate.

In FIG. 13, the structure of FIG. 6 is flipped and side 14 is recessed to surface 58, similar to the process of FIG. 7. Again, arrow 56 is considered to point downward for the purposes of this description despite the actual orientation of the semiconductor substrate 10 during processing. In FIG. 13, a MEMS device layer 110 is bonded to the recessed surface 58. For example, the MEMS device layer 110 may include an intermediate layer 112 and a semiconductor layer 114. An exemplary intermediate layer 112 is a conductive material such as gold, aluminum, an alloy thereof or another conventional alloy for eutectic bonding. An exemplary semiconductor layer 114 is silicon.

In FIG. 14, a conductive layer 116 is formed under the semiconductor layer 114. For example, a metal such as copper, tungsten, or aluminum or alloys thereof may be deposited, such as by PVD. Masks may be sequentially formed and patterned to etch the metal to form the conductive layer 116 and to etch openings 120 through the semiconductor layer 114. Then, the intermediate layer exposed by the openings 120 may be removed by an etch process such as an etch with vapor hydrofluoric acid (VHF). Then, trenches 126 may be etched through the conductive layer 116, the semiconductor layer 114 and intermediate layer 112 and filled with a conductive material to form conductive pads 128. An exemplary conductive material is aluminum.

In FIG. 15, the openings 120 are filled with a thin film 130. For example, a plasma enhanced chemical vapor deposition (PECVD) process may be performed to deposit a thin film material, such as for example silicon oxide or amorphous silicon. As a result, a MEMS device 96 is formed in the MEMS device layer 110 under side 14 of semiconductor substrate 10.

Cross-referencing FIGS. 12 and 15, it is noted that an exemplary MEMS device 96 is a radiofrequency (RF) MEMS device. The MEMS device 96 may be a switch, variable capacitor, surface acoustic wave (SAW) filter, bulk acoustic wave (BAW) filter, film bulk acoustic resonator (FBAR) filter, or other non-RF MEMS device such as a pressure sensor, optical device, microfluidic device, or other device as desired.

Further, the MEMS device 96 may be selectively electrically connected with the CMOS devices 30 formed over side 12 of the semiconductor substrate 10. Specifically, each electrode 68 and 76 of the MEMS device 96 may be connected through selected conductive pads 90 or 128, through interconnect 26, through contact plug 40, and through conductive lines 44 to CMOS devices 30. As shown, the structure in each of FIGS. 12 and 15 forms an integrated MEMS-CMOS device 100.

As described in FIGS. 1-12 and 13-15, the methods provide for fabrication of at least one CMOS device on one side of a semiconductor substrate and of at least one MEMS device on the opposite side of the semiconductor substrate. Thus, the CMOS device(s) and MEMS device(s) are vertically aligned. The distance between the CMOS device(s) and MEMS device(s) includes the thickness of the semiconductor substrate 10, i.e., the distance between the surface of each side of the semiconductor substrate. Further, the semiconductor substrate may be provided as high resistivity silicon, thereby further inhibiting cross talk between MEMS and CMOS devices. Also, due to the vertical alignment of the CMOS device(s) and MEMS device(s), the integrated MEMS-CMOS device takes up less chip size as compared to conventional side-by-side structures.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. A method for fabricating a MEMS device and a CMOS device, the method comprising:
   forming the CMOS device in and/or directly on a first side of a bulk semiconductor wafer; and
   etching a via into the first side of the bulk semiconductor wafer;
   forming an interconnect in the via;
   forming an interlayer dielectric over the CMOS device and the first side of the bulk semiconductor wafer;
   etching a first trench through the interlayer dielectric to expose the interconnect;
   forming a first conductive structure in the first trench to electrically connect the CMOS device and the interconnect;
   recessing a second side of the bulk semiconductor wafer to expose the interconnect;
   bonding an intermediate layer and a semiconductor layer to the second side of the bulk semiconductor wafer;
   forming the MEMS device directly on the second side of the bulk semiconductor wafer, wherein the second side of the bulk semiconductor wafer is opposite the first side of the bulk semiconductor wafer, wherein forming the MEMS device directly on the second side of the bulk semiconductor wafer comprises forming the MEMS device within the intermediate layer and within the semiconductor layer;
   etching a second trench through the semiconductor layer and the intermediate layer to expose the interconnect; and
   forming a second conductive structure in the second trench to electrically connect the CMOS device and the interconnect, wherein the second conductive structure contacts the second side of the bulk semiconductor wafer.

2. The method of claim 1 wherein bonding the intermediate layer and the semiconductor layer to the second side of the bulk semiconductor wafer and forming the MEMS device directly on the second side of the bulk semiconductor wafer comprises:
   bonding the intermediate layer directly on the second side of the bulk semiconductor wafer;
   bonding the semiconductor layer on directly on the intermediate layer; and
   etching an opening through the semiconductor layer and through the intermediate layer, wherein the opening is bounded by the second side of the bulk semiconductor wafer.

3. The method of claim 1 wherein forming the CMOS device in and/or directly on the first side of the bulk semiconductor wafer comprises forming the CMOS device in and/or directly on the first side of a high resistivity silicon wafer.

4. The method of claim 1 wherein forming the MEMS device directly on the second side of the bulk semiconductor wafer comprises performing a bulk micromachining process to form the MEMS device in the semiconductor layer.

5. The method of claim 1 further comprising converting the second side of the bulk semiconductor wafer into a trap-rich layer, wherein forming the MEMS device directly on the second side of the bulk semiconductor wafer comprises forming the MEMS device directly on the trap-rich layer.

6. A method for fabricating a vertically integrated MEMS-CMOS device, the method comprising:
   providing a semiconductor substrate defining a center plane;
   forming a CMOS device on the semiconductor substrate;
   forming a MEMS device on the semiconductor substrate, wherein the center plane is located between the CMOS device and the MEMS device; and
   electrically connecting the CMOS device and the MEMS device with an interconnect extending through the semiconductor substrate, wherein electrically connecting the CMOS device and the MEMS device with the interconnect extending through the semiconductor substrate comprises:
   forming an interlayer dielectric over the CMOS device;
   etching a first trench through the interlayer dielectric to expose the interconnect;
   forming a first conductive structure in the first trench to electrically connect the CMOS device and the interconnect;
   bonding a semiconductor layer to the semiconductor substrate, wherein forming the MEMS device on the semiconductor substrate comprises forming the MEMS device in and/or under the semiconductor layer;
   etching a second trench through the semiconductor layer to expose the interconnect; and
   forming a second conductive structure in the second trench to electrically connect the CMOS device and the interconnect.

7. The method of claim 6 further comprising:
   forming a via through the semiconductor substrate, wherein the via passes through the center plane;
   forming the interconnect in the via.

8. The method of claim 6 wherein providing the semiconductor substrate defining a center plane comprises providing a high resistivity silicon wafer.

9. The method of claim 6 further comprising:
   forming an interlayer dielectric over the CMOS device, wherein the interlayer dielectric defines an upper surface; and
   bonding a protective layer to the upper surface of the interlayer dielectric.

10. The method of claim 6 further comprising:
    forming an interlayer dielectric over the CMOS device, wherein the interlayer dielectric defines an upper surface; and
    depositing a protective material over the upper surface of the interlayer dielectric.

11. The method of claim 6 wherein forming the MEMS device on the semiconductor substrate comprises performing a bulk micromachining process to form the MEMS device in the semiconductor layer.

12. A method for fabricating a MEMS device and a CMOS device, the method comprising:
- forming the CMOS device in and/or over a first side of a semiconductor substrate;
- forming an interconnect through the first side of the semiconductor substrate;
- forming an interlayer dielectric over the first side of the semiconductor substrate;
- etching a first trench through the interlayer dielectric to expose the interconnect;
- forming a first conductive structure in the first trench to electrically connect the CMOS device and the interconnect;
- bonding a semiconductor layer to a second side of the semiconductor substrate opposite the first side;
- forming a MEMS device in and/or under the semiconductor layer;
- etching a second trench through the semiconductor layer to expose the interconnect; and
- forming a second conductive structure in the second trench to electrically connect the MEMS device and the interconnect.

* * * * *